United States Patent
Hemington et al.

(10) Patent No.: US 12,158,906 B2
(45) Date of Patent: Dec. 3, 2024

(54) SYSTEMS AND METHODS FOR GENERATING QUERY RESPONSES

(71) Applicant: Shopify Inc., Ottawa (CA)

(72) Inventors: Kasey Hemington, Ottawa (CA); Alejandro Cantarero, Los Angeles, CA (US); Curtis Holmes, Ottawa (CA)

(73) Assignee: Shopify Inc., Ottawa (CA)

( * ) Notice: Subject to any disclaimer, the term of this patent is extended or adjusted under 35 U.S.C. 154(b) by 0 days.

(21) Appl. No.: 18/326,381

(22) Filed: May 31, 2023

(65) Prior Publication Data

US 2024/0320251 A1     Sep. 26, 2024

Related U.S. Application Data

(60) Provisional application No. 63/491,874, filed on Mar. 23, 2023.

(51) Int. Cl.
| | |
|---|---|
| *G06F 16/00* | (2019.01) |
| *G06F 16/338* | (2019.01) |
| *G06F 16/35* | (2019.01) |
| *G06F 30/27* | (2020.01) |

(52) U.S. Cl.
CPC ............ *G06F 16/338* (2019.01); *G06F 16/35* (2019.01); *G06F 30/27* (2020.01)

(58) Field of Classification Search
CPC ......... G06F 16/338; G06F 16/35; G06F 30/27
See application file for complete search history.

(56) References Cited

U.S. PATENT DOCUMENTS

| | | | |
|---|---|---|---|
| 10,853,580 B1 * | 12/2020 | Amrite | G06N 3/08 |
| 11,676,044 B1 | 6/2023 | Mazza et al. | |
| 2004/0139067 A1 * | 7/2004 | Houle | G06F 16/93 |
| 2018/0121429 A1 * | 5/2018 | Agrawal | G06F 16/3326 |
| 2019/0205385 A1 * | 7/2019 | Gusakov | G06F 40/169 |
| 2023/0033979 A1 * | 2/2023 | Jones | G06F 16/353 |
| 2023/0252049 A1 | 8/2023 | Na et al. | |
| 2023/0281389 A1 | 9/2023 | Lee et al. | |
| 2023/0315999 A1 | 10/2023 | Mohammed et al. | |

FOREIGN PATENT DOCUMENTS

WO     2020227150 A1     11/2020

OTHER PUBLICATIONS

PCT, Written Opinion of the International Search Authority and International Search Report relating to application No. PCT/CA2023/051327 dated Jan. 9, 2024.

\* cited by examiner

*Primary Examiner* — Diedra McQuitery
(74) *Attorney, Agent, or Firm* — Rowand LLP

(57) ABSTRACT

A computer-implemented method is disclosed. The method includes: obtaining at least one query; clustering a set comprising the at least one query into first clusters; for each first cluster, identifying, by a large language model (LLM), queries in the cluster that are semantically dissimilar; clustering the queries identified as semantically dissimilar into one or more second clusters; receiving an incoming query; matching the incoming query to a particular cluster from the first or second clusters; obtaining one or more generated response messages based on providing, to the LLM, data associated with the particular cluster for the incoming query.

20 Claims, 7 Drawing Sheets

SYSTEMS AND METHODS FOR GENERATING QUERY RESPONSES

CROSS-REFERENCE TO RELATED APPLICATION

The present application claims the benefit of priority to U.S. Provisional Patent Application No. 63/491,874 filed on Mar. 23, 2023, the contents of which are incorporated herein by reference.

TECHNICAL FIELD

The present disclosure relates to query resolution and, more particularly, to techniques that leverage use of large language models (LLMs) for generating responses to data queries.

BACKGROUND

Query resolution involves a series of complex tasks that can be difficult to automate. Examples of such tasks include: understanding the content of a query and identifying one or more associated questions, researching a solution to the identified questions(s), and composing a response that indicates at least one solution and relevant resources.

BRIEF DESCRIPTION OF THE DRAWINGS

Reference will now be made, by way of example only, to the accompanying drawings which show example embodiments of the present application, and in which.

Like reference numerals are used in the drawings to denote like elements and features.

DETAILED DESCRIPTION OF IMPLEMENTATIONS

Figure 1:
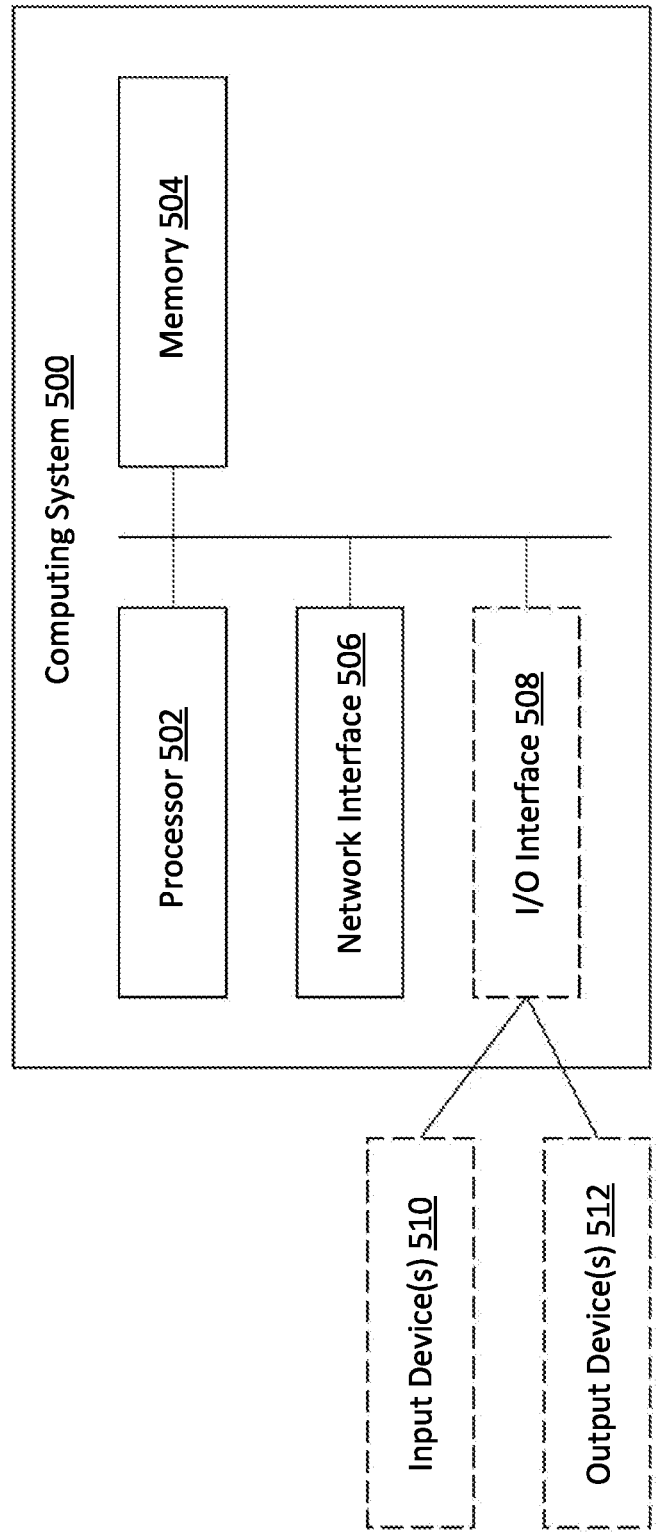
FIG. 1 is a block diagram of an example computing system, which may be used to implement examples of the present disclosure.

In an aspect, the present application discloses a computer-implemented method. The method may include: obtaining at least one query; clustering a set comprising the at least one query into first clusters; for each first cluster, identifying, by a large language model (LLM), queries in the cluster that are semantically dissimilar; clustering the queries identified as semantically dissimilar into one or more second clusters; receiving an incoming query; matching the incoming query to a particular cluster from the first or second clusters; obtaining one or more generated response messages based on providing, to the LLM, data associated with the particular cluster for the incoming query.

In some implementations, the one or more generated response messages may include at least one prompt for the LLM for generating additional responses.

In some implementations, the one or more generated response messages may include representative examples of responses based on those associated with queries of a single cluster.

In some implementations, the method may further include generating, for each query of the at least one query, an embedding and performing the clustering may include creating clusters based on the embeddings associated with the queries.

In some implementations, the embedding may comprise a feature vector containing a first vector representing an embedding of the query and a second vector associated with defined domain-specific keywords.

In some implementations, obtaining the one or more generated response messages may include providing, to the LLM, one or more solution steps associated with the particular cluster for the incoming query.

In some implementations, the method may further include providing instructions for the LLM to identify and summarize the at least one query.

In some implementations, clustering the set comprising the at least one query may include defining at least one semantic similarity threshold for cluster creation.

In some implementations, clustering the queries identified as semantically dissimilar into one or more second clusters may include identifying queries that are the same query and creating a new cluster level label and assigning the identified queries to the new cluster.

In some implementations, obtaining the one or more generated response messages may include further providing, to the LLM, input of text associated with a related resource document.

In another aspect, the present application discloses a computing system. The computing system includes a processor and a memory coupled to the processor. The memory stores computer-executable instructions that, when executed by the processor, may cause the processor to: obtain at least one query; cluster a set comprising the at least one query into first clusters; for each first cluster, identify, by a large language model (LLM), queries in the cluster that are semantically dissimilar; cluster the queries identified as semantically dissimilar into one or more second clusters; receive an incoming query; match the incoming query to a particular cluster from the first or second clusters; and obtain one or more generated response messages based on providing, to the LLM, data associated with the particular cluster for the incoming query.

In another aspect, the present application discloses a non-transitory, processor-readable medium storing processor-executable instructions that, when executed by a processor, may cause the processor to: obtain at least one query; cluster a set comprising the at least one query into first clusters; for each first cluster, identify, by a large language model (LLM), queries in the cluster that are semantically dissimilar; cluster the queries identified as semantically dissimilar into one or more second clusters; receive an incoming query; match the incoming query to a particular cluster from the first or second clusters; and obtain one or more generated response messages based on providing, to the LLM, data associated with the particular cluster for the incoming query.

Other example implementations of the present disclosure will be apparent to those of ordinary skill in the art from a review of the following detailed descriptions in conjunction with the drawings.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . and . . . " is intended to cover any one or more of the listed elements, including any one of the listed elements alone, any sub-combination, or all of the elements, without necessarily excluding any additional elements, and without necessarily requiring all of the elements.

In the present application, the term "generative AI model" may be used to describe a machine learning model. A generative AI model may sometimes be referred to, or may use, a language learning model. A trained generative AI model may respond to an input prompt by generating and producing an output or result. The output/result may be generated by the generative AI model through interpreting the intent and context of the prompt. In some cases, the generative AI model may be implemented with constraints on the acceptable prompts. In some cases, this may include a prompt template. A prompt template may specify that prompts have a certain structure or constrained intents, or that acceptable prompts exclude certain classes of subject matter or intent, such as the production of results or outputs that are violent, pornographic, etc.

Significant advances have been made in recent years in generative AI models. Different implementations may be trained to create digital art, computer code, conversation text responses, or other types of outputs. Examples of generative AI models include Stable Diffusion by Stability AI Ltd., ChatGPT by OpenAI, DALL-E 2 by OpenAI, and GitHub CoPilot by GitHub and OpenAI. The models are typically trained using a large data set of training data. For instance, in the case of AI for generating images, the training data set may include a database of millions of images tagged with information regarding the contents, style, artist, context, or other data about the image or its manner of creation. The generative AI trained on such a data set is then able to take an input prompt in text form, which may include suggested topics, features, styles or other suggestions, and provide an output image that reflects, at least to some degree, the input prompt.

Query Resolution Using LLMs

Automated handling of queries may engage a large language model (LLM) for generating query responses. An incoming query may be provided to a trained LLM with a suitable prompt instructing the LLM to generate responses to the query. For example, in the context of a service platform, an LLM can be supplied with information about the services that are provided to customers and various user actions that are available to be performed on the platform. In particular, an LLM may be fine-tuned using training data such as documentation (e.g., help docs, forums, blog posts, etc.) relating to the platform's services.

There are certain drawbacks to relying primarily on an LLM for automated query resolution. First, the responses that are generated by an LLM for a service platform may become stale over time. For example, an LLM's responses may become outdated as new services are added to the platform, new components are added to existing services, or user actions are modified. More generally, changes to the platform's underlying information would require frequent re-training of the LLM, which can be a time-consuming and resource-intensive process. Training an LLM using multiple examples of the same type of query/response may be impractical, as the occurrence of queries may not be uniform across the different possible queries.

Furthermore, even a fine-tuned LLM may not be capable of distinguishing between semantically similar queries that have subtle differences. For example, a pair of queries that contain the same high-level question may each be associated with distinct contextual data (e.g., country of query origin, state information of users, etc.). Without manual review of the queries and expression of the relevant contexts in input prompts, an LLM may fail to detect a semantic difference between such similar queries.

If an LLM is not fine-tuned, it may face other challenges in query resolution. To reduce the time taken to find a solution to an incoming query, it may be desirable for an LLM to compare the incoming query to previous queries that contained the same question. The solutions corresponding to such previous queries may be known and stored in association with the queries. However, if the dataset of previous queries is large, and given the constraints (e.g., character limit) on prompts which may be input to an LLM, it may not be efficient or feasible to directly feed in the incoming query along with the entire dataset of previous queries and instruct the LLM to choose the most similar queries as part of generating a response to the incoming query.

The present application discloses techniques for query resolution that address the abovementioned technical limitations. More particularly, a system for automatically generating query responses using an LLM is described. When an inbound message is received by the system, a query (e.g., issue, question, etc.) is extracted from the message. Clustering is performed on the queries that are received by the system to create clusters of similar queries. An LLM is employed to refine the clusters. Specifically, an LLM may be instructed to verify whether the queries of a same cluster represent the "same" query and to identify any that are deemed to be dissimilar to other queries in the cluster. In this way, an LLM may facilitate distinguishing between queries in a same cluster whose embeddings are close together in a feature space but which may be semantically distinct. The system may generate responses to an incoming query by matching the query to a particular one of the clusters and obtaining response messages based on data associated with the matching cluster.

To illustrate additional details regarding the methods and systems of the present application, some concepts relevant to generative AI models, neural networks, and machine learning (ML) are first discussed.

Generally, a neural network comprises a number of computation units (sometimes referred to as "neurons"). Each neuron receives an input value and applies a function to the input to generate an output value. The function typically includes a parameter (also referred to as a "weight") whose value is learned through the process of training. A plurality of neurons may be organized into a neural network layer (or simply "layer") and there may be multiple such layers in a neural network. The output of one layer may be provided as input to a subsequent layer. Thus, input to a neural network may be processed through a succession of layers until an output of the neural network is generated by a final layer. This is a simplistic discussion of neural networks and there may be more complex neural network designs that include feedback connections, skip connections, and/or other such possible connections between neurons and/or layers, which need not be discussed in detail here.

A deep neural network (DNN) is a type of neural network having multiple layers and/or a large number of neurons. The term DNN may encompass any neural network having multiple layers, including convolutional neural networks (CNNs), recurrent neural networks (RNNs), and multilayer perceptrons (MLPs), among others.

DNNs are often used as ML-based models for modeling complex behaviors (e.g., human language, image recognition, object classification, etc.) in order to improve accuracy of outputs (e.g., more accurate predictions) such as, for example, as compared with models with fewer layers. In the present disclosure, the term "ML-based model" or more simply "ML model" may be understood to refer to a DNN. Training an ML model refers to a process of learning the values of the parameters (or weights) of the neurons in the layers such that the ML model is able to model the target behavior to a desired degree of accuracy. Training typically requires the use of a training dataset, which is a set of data that is relevant to the target behavior of the ML model. For example, to train an ML model that is intended to model human language (also referred to as a language model), the training dataset may be a collection of text documents, referred to as a text corpus (or simply referred to as a corpus). The corpus may represent a language domain (e.g., a single language), a subject domain (e.g., scientific papers), and/or may encompass another domain or domains, be they larger or smaller than a single language or subject domain. For example, a relatively large, multilingual and non-subject-specific corpus may be created by extracting text from online webpages and/or publicly available social media posts. In another example, to train an ML model that is intended to classify images, the training dataset may be a collection of images. Training data may be annotated with ground truth labels (e.g., each data entry in the training dataset may be paired with a label), or may be unlabeled.

Training an ML model generally involves inputting into an ML model (e.g., an untrained ML model) training data to be processed by the ML model, processing the training data using the ML model, collecting the output generated by the ML model (e.g., based on the inputted training data), and comparing the output to a desired set of target values. If the training data is labeled, the desired target values may be, e.g., the ground truth labels of the training data. If the training data is unlabeled, the desired target value may be a reconstructed (or otherwise processed) version of the corresponding ML model input (e.g., in the case of an autoencoder), or may be a measure of some target observable effect on the environment (e.g., in the case of a reinforcement learning agent). The parameters of the ML model are updated based on a difference between the generated output value and the desired target value. For example, if the value outputted by the ML model is excessively high, the parameters may be adjusted so as to lower the output value in future training iterations. An objective function is a way to quantitatively represent how close the output value is to the target value. An objective function represents a quantity (or one or more quantities) to be optimized (e.g., minimize a loss or maximize a reward) in order to bring the output value as close to the target value as possible. The goal of training the ML model typically is to minimize a loss function or maximize a reward function.

The training data may be a subset of a larger data set. For example, a data set may be split into three mutually exclusive subsets: a training set, a validation (or cross-validation) set, and a testing set. The three subsets of data may be used sequentially during ML model training. For example, the training set may be first used to train one or more ML models, each ML model, e.g., having a particular architecture, having a particular training procedure, being describable by a set of model hyperparameters, and/or otherwise being varied from the other of the one or more ML models. The validation (or cross-validation) set may then be used as input data into the trained ML models to, e.g., measure the performance of the trained ML models and/or compare performance between them. Where hyperparameters are used, a new set of hyperparameters may be determined based on the measured performance of one or more of the trained ML models, and the first step of training (i.e., with the training set) may begin again on a different ML model described by the new set of determined hyperparameters. In this way, these steps may be repeated to produce a more performant trained ML model. Once such a trained ML model is obtained (e.g., after the hyperparameters have been adjusted to achieve a desired level of performance), a third step of collecting the output generated by the trained ML model applied to the third subset (the testing set) may begin. The output generated from the testing set may be compared with the corresponding desired target values to give a final assessment of the trained ML model's accuracy. Other segmentations of the larger data set and/or schemes for using the segments for training one or more ML models are possible.

Backpropagation is an algorithm for training an ML model. Backpropagation is used to adjust (also referred to as update) the value of the parameters in the ML model, with the goal of optimizing the objective function. For example, a defined loss function is calculated by forward propagation of an input to obtain an output of the ML model and comparison of the output value with the target value. Backpropagation calculates a gradient of the loss function with respect to the parameters of the ML model, and a gradient algorithm (e.g., gradient descent) is used to update (i.e., "learn") the parameters to reduce the loss function. Backpropagation is performed iteratively, so that the loss function is converged or minimized. Other techniques for learning the parameters of the ML model may be used. The process of updating (or learning) the parameters over many iterations is referred to as training. Training may be carried out iteratively until a convergence condition is met (e.g., a predefined maximum number of iterations has been performed, or the value outputted by the ML model is sufficiently converged with the desired target value), after which the ML model is considered to be sufficiently trained. The values of the learned parameters may then be fixed and the ML model may be deployed to generate output in real-world applications (also referred to as "inference").

In some examples, a trained ML model may be fine-tuned, meaning that the values of the learned parameters may be adjusted slightly in order for the ML model to better model a specific task. Fine-tuning of an ML model typically involves further training the ML model on a number of data samples (which may be smaller in number/cardinality than those used to train the model initially) that closely target the specific task. For example, an ML model for generating natural language that has been trained generically on publicly-available text corpuses may be, e.g., fine-tuned by further training using the complete works of Shakespeare as training data samples (e.g., where the intended use of the ML model is generating a scene of a play or other textual content in the style of Shakespeare).

Figure 2:
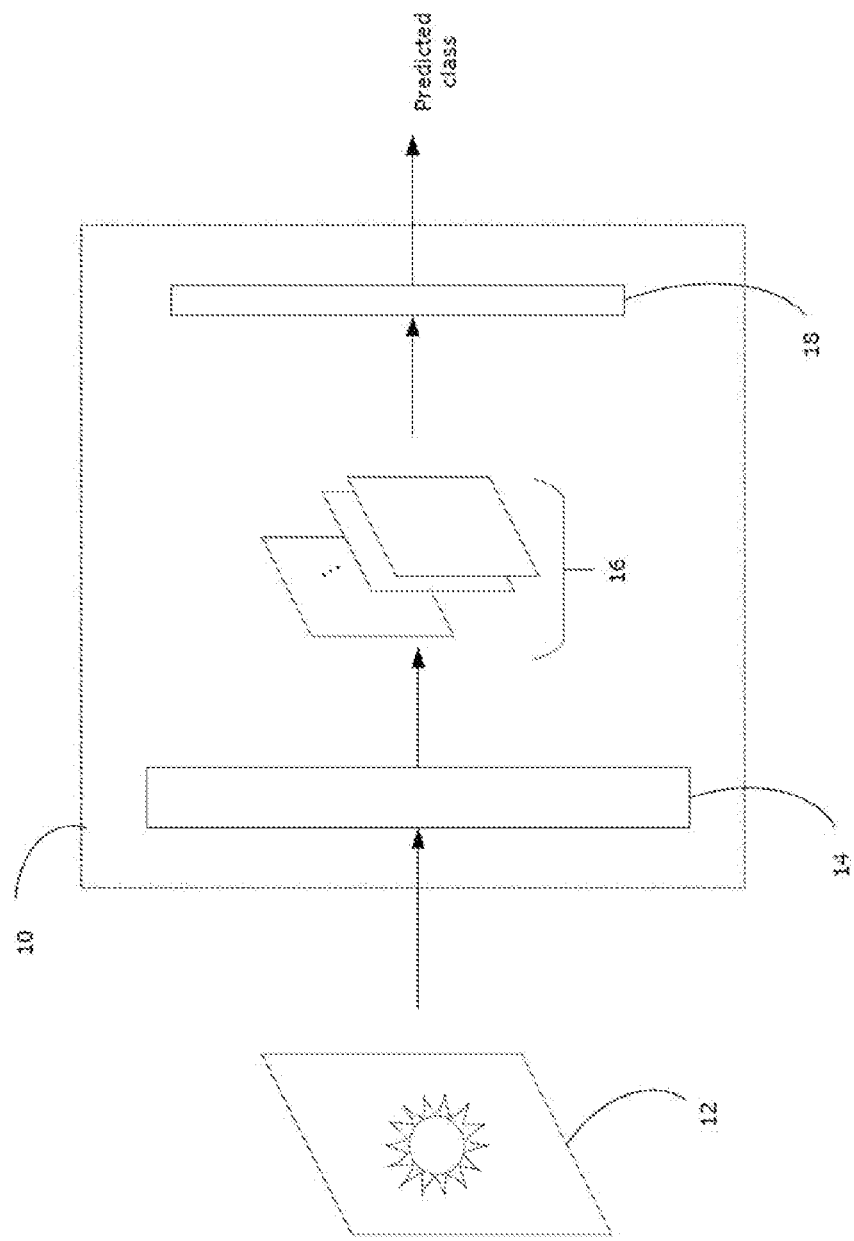
FIG. 2 is a block diagram of a simplified convolutional neural network, which may be used in examples of the present disclosure.

FIG. 2 is a simplified diagram of an example CNN 10, which is an example of a DNN that is commonly used for image processing tasks such as image classification, image analysis, object segmentation, etc. An input to the CNN 10 may be a 2D RGB image 12.

The CNN 10 includes a plurality of layers that process the image 12 in order to generate an output, such as a predicted classification or predicted label for the image 12. For simplicity, only a few layers of the CNN 10 are illustrated including at least one convolutional layer 14. The convolutional layer 14 performs convolution processing, which may involve computing a dot product between the input to the convolutional layer 14 and a convolution kernel. A convolutional kernel is typically a 2D matrix of learned parameters that is applied to the input in order to extract image features. Different convolutional kernels may be applied to extract different image information, such as shape information, color information, etc.

The output of the convolution layer 14 is a set of feature maps 16 (sometimes referred to as activation maps). Each feature map 16 generally has smaller width and height than the image 12. The set of feature maps 16 encode image features that may be processed by subsequent layers of the CNN 10, depending on the design and intended task for the CNN 10. In this example, a fully connected layer 18 processes the set of feature maps 16 in order to perform a classification of the image, based on the features encoded in the set of feature maps 16. The fully connected layer 18 contains learned parameters that, when applied to the set of feature maps 16, outputs a set of probabilities representing the likelihood that the image 12 belongs to each of a defined set of possible classes. The class having the highest probability may then be outputted as the predicted classification for the image 12.

In general, a CNN may have different numbers and different types of layers, such as multiple convolution layers, max-pooling layers and/or a fully connected layer, among others. The parameters of the CNN may be learned through training, using data having ground truth labels specific to the desired task (e.g., class labels if the CNN is being trained for a classification task, pixel masks if the CNN is being trained for a segmentation task, text annotations if the CNN is being trained for a captioning task, etc.), as discussed above.

Some concepts in ML-based language models are now discussed. It may be noted that, while the term "language model" has been commonly used to refer to an ML-based language model, there could exist non-ML language models. In the present disclosure, the term "language model" may be used as shorthand for ML-based language model (i.e., a language model that is implemented using a neural network or other ML architecture), unless stated otherwise. For example, unless stated otherwise, "language model" encompasses LLMs.

A language model may use a neural network (typically a DNN) to perform natural language processing (NLP) tasks such as language translation, image captioning, grammatical error correction, and language generation, among others. A language model may be trained to model how words relate to each other in a textual sequence, based on probabilities. A language model may contain hundreds of thousands of learned parameters or in the case of a large language model (LLM) may contain millions or billions of learned parameters or more.

In recent years, there has been interest in a type of neural network architecture, referred to as a transformer, for use as language models. For example, the Bidirectional Encoder Representations from Transformers (BERT) model, the Transformer-XL model and the Generative Pre-trained Transformer (GPT) models are types of transformers. A transformer is a type of neural network architecture that uses self-attention mechanisms in order to generate predicted output based on input data that has some sequential meaning (i.e., the order of the input data is meaningful, which is the case for most text input). Although transformer-based language models are described herein, it should be understood that the present disclosure may be applicable to any ML-based language model, including language models based on other neural network architectures such as recurrent neural network (RNN)-based language models.

Figure 3:
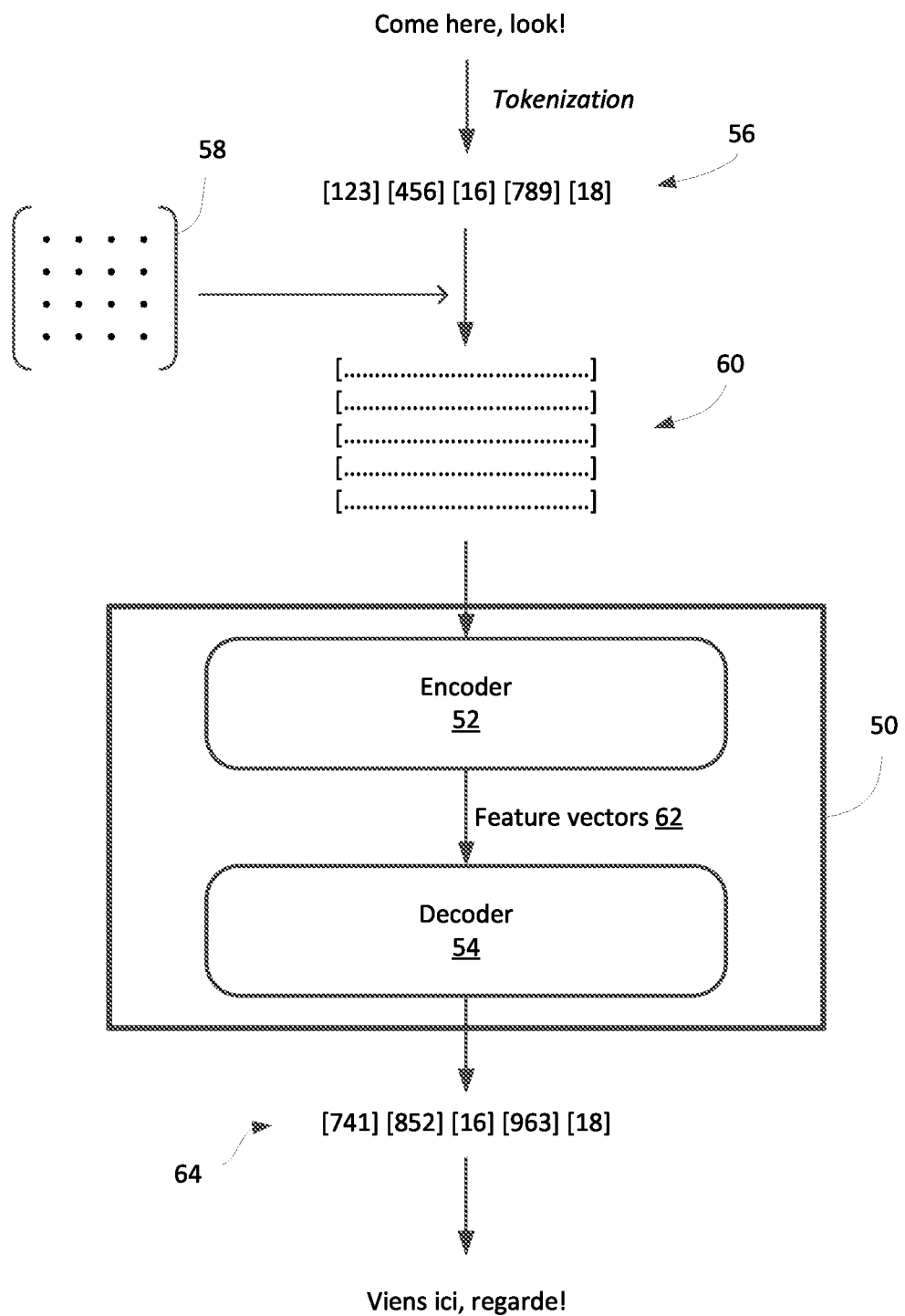
FIG. 3 is a block diagram of a simplified transformer neural network, which may be used in examples of the present disclosure.

FIG. 3 is a simplified diagram of an example transformer 50, and a simplified discussion of its operation is now provided. The transformer 50 includes an encoder 52 (which may comprise one or more encoder layers/blocks connected in series) and a decoder 54 (which may comprise one or more decoder layers/blocks connected in series). Generally, the encoder 52 and the decoder 54 each include a plurality of neural network layers, at least one of which may be a self-attention layer. The parameters of the neural network layers may be referred to as the parameters of the language model.

The transformer 50 may be trained on a text corpus that is labelled (e.g., annotated to indicate verbs, nouns, etc.) or unlabelled. LLMs may be trained on a large unlabelled corpus. Some LLMs may be trained on a large multi-language, multi-domain corpus, to enable the model to be versatile at a variety of language-based tasks such as generative tasks (e.g., generating human-like natural language responses to natural language input).

An example of how the transformer 50 may process textual input data is now described. Input to a language model (whether transformer-based or otherwise) typically is in the form of natural language as may be parsed into tokens. It should be appreciated that the term "token" in the context of language models and NLP has a different meaning from the use of the same term in other contexts such as data security. Tokenization, in the context of language models and NLP, refers to the process of parsing textual input (e.g., a character, a word, a phrase, a sentence, a paragraph, etc.) into a sequence of shorter segments that are converted to numerical representations referred to as tokens (or "compute tokens"). Typically, a token may be an integer that corresponds to the index of a text segment (e.g., a word) in a vocabulary dataset. Often, the vocabulary dataset is arranged by frequency of use. Commonly occurring text, such as punctuation, may have a lower vocabulary index in the dataset and thus be represented by a token having a smaller integer value than less commonly occurring text. Tokens frequently correspond to words, with or without whitespace appended. In some examples, a token may correspond to a portion of a word. For example, the word "lower" may be represented by a token for [low] and a second token for [er]. In another example, the text sequence "Come here, look!" may be parsed into the segments [Come], [here], [,], [look] and [!], each of which may be represented by a respective numerical token. In addition to tokens that are parsed from the textual sequence (e.g., tokens that correspond to words and punctuation), there may also be special tokens to encode non-textual information. For example, a [CLASS] token may be a special token that corresponds to a classification of the textual sequence (e.g., may classify the textual sequence as a poem, a list, a paragraph, etc.), a [EOT] token may be another special token that indicates the end of the textual sequence, other tokens may provide formatting information, etc.

In FIG. 3, a short sequence of tokens 56 corresponding to the text sequence "Come here, look!" is illustrated as input to the transformer 50. Tokenization of the text sequence into the tokens 56 may be performed by some pre-processing tokenization module such as, for example, a byte pair encoding tokenizer (the "pre" referring to the tokenization occurring prior to the processing of the tokenized input by the LLM), which is not shown in FIG. 9 for simplicity. In general, the token sequence that is inputted to the transformer 50 may be of any length up to a maximum length defined based on the dimensions of the transformer 50 (e.g., such a limit may be 2048 tokens in some LLMs). Each token 56 in the token sequence is converted into an embedding vector 60 (also referred to simply as an embedding). An embedding 60 is a learned numerical representation (such as, for example, a vector) of a token that captures some semantic meaning of the text segment represented by the token 56. The embedding 60 represents the text segment corresponding to the token 56 in a way such that embeddings corresponding to semantically-related text are closer to each other in a vector space than embeddings corresponding to semantically-unrelated text. For example, assuming that the words "look", "see", and "cake" each correspond to, respectively, a "look" token, a "see" token, and a "cake" token when tokenized, the embedding 60 corresponding to the "look" token will be closer to another embedding corresponding to the "see" token in the vector space, as compared to the distance between the embedding 60 corresponding to the "look" token and another embedding corresponding to the "cake" token. The vector space may be defined by the dimensions and values of the embedding vectors. Various techniques may be used to convert a token 56 to an embedding 60. For example, another trained ML model may be used to convert the token 56 into an embedding 60. In particular, another trained ML model may be used to convert the token 56 into an embedding 60 in a way that encodes additional information into the embedding 60 (e.g., a trained ML model may encode positional information about the position of the token 56 in the text sequence into the embedding 60). In some examples, the numerical value of the token 56 may be used to look up the corresponding embedding in an embedding matrix 58 (which may be learned during training of the transformer 50).

The generated embeddings 60 are input into the encoder 52. The encoder 52 serves to encode the embeddings 60 into feature vectors 62 that represent the latent features of the embeddings 60. The encoder 52 may encode positional information (i.e., information about the sequence of the input) in the feature vectors 62. The feature vectors 62 may have very high dimensionality (e.g., on the order of thousands or tens of thousands), with each element in a feature vector 62 corresponding to a respective feature. The numerical weight of each element in a feature vector 62 represents the importance of the corresponding feature. The space of all possible feature vectors 62 that can be generated by the encoder 52 may be referred to as the latent space or feature space.

Conceptually, the decoder 54 is designed to map the features represented by the feature vectors 62 into meaningful output, which may depend on the task that was assigned to the transformer 50. For example, if the transformer 50 is used for a translation task, the decoder 54 may map the feature vectors 62 into text output in a target language different from the language of the original tokens 56. Generally, in a generative language model, the decoder 54 serves to decode the feature vectors 62 into a sequence of tokens. The decoder 54 may generate output tokens 64 one by one. Each output token 64 may be fed back as input to the decoder 54 in order to generate the next output token 64. By feeding back the generated output and applying self-attention, the decoder 54 is able to generate a sequence of output tokens 64 that has sequential meaning (e.g., the resulting output text sequence is understandable as a sentence and obeys grammatical rules). The decoder 54 may generate output tokens 64 until a special [EOT] token (indicating the end of the text) is generated. The resulting sequence of output tokens 64 may then be converted to a text sequence in post-processing. For example, each output token 64 may be an integer number that corresponds to a vocabulary index. By looking up the text segment using the vocabulary index, the text segment corresponding to each output token 64 can be retrieved, the text segments can be concatenated together and the final output text sequence (in this example, "Viens ici, regarde!") can be obtained.

Although a general transformer architecture for a language model and its theory of operation have been described above, this is not intended to be limiting. Existing language models include language models that are based only on the encoder of the transformer or only on the decoder of the transformer. An encoder-only language model encodes the input text sequence into feature vectors that can then be further processed by a task-specific layer (e.g., a classification layer). BERT is an example of a language model that may be considered to be an encoder-only language model. A decoder-only language model accepts embeddings as input and may use auto-regression to generate an output text sequence. Transformer-XL and GPT-type models may be language models that are considered to be decoder-only language models.

Because GPT-type language models tend to have a large number of parameters, these language models may be considered LLMs. An example GPT-type LLM is GPT-3. GPT-3 is a type of GPT language model that has been trained (in an unsupervised manner) on a large corpus derived from documents available to the public online. GPT-3 has a very large number of learned parameters (on the order of hundreds of billions), is able to accept a large number of tokens as input (e.g., up to 2048 input tokens), and is able to generate a large number of tokens as output (e.g., up to 2048 tokens). GPT-3 has been trained as a generative model, meaning that it can process input text sequences to predictively generate a meaningful output text sequence. ChatGPT is built on top of a GPT-type LLM, and has been fine-tuned with training datasets based on text-based chats (e.g., chatbot conversations). ChatGPT is designed for processing natural language, receiving chat-like inputs and generating chat-like outputs.

A computing system may access a remote language model (e.g., a cloud-based language model), such as ChatGPT or GPT-3, via a software interface (e.g., an application programming interface (API)). Additionally, or alternatively, such a remote language model may be accessed via a network such as, for example, the Internet. In some implementations such as, for example, potentially in the case of a cloud-based language model, a remote language model may be hosted by a computer system as may include a plurality of cooperating (e.g., cooperating via a network) computer systems such as may be in, for example, a distributed arrangement. Notably, a remote language model may employ a plurality of processors (e.g., hardware processors such as, for example, processors of cooperating computer systems). Indeed, processing of inputs by an LLM may be computationally expensive/may involve a large number of operations (e.g., many instructions may be executed/large data structures may be accessed from memory) and providing output in a required timeframe (e.g., real-time or near real-time) may require the use of a plurality of processors/cooperating computing devices as discussed above.

Inputs to an LLM may be referred to as a prompt, which is a natural language input that includes instructions to the LLM to generate a desired output. A computing system may generate a prompt that is provided as input to the LLM via its API. As described above, the prompt may optionally be processed or pre-processed into a token sequence prior to being provided as input to the LLM via its API. A prompt can include one or more examples of the desired output, which provides the LLM with additional information to enable the LLM to better generate output according to the desired output. Additionally, or alternatively, the examples included in a prompt may provide inputs (e.g., example inputs) corresponding to/as may be expected to result in the desired outputs provided. A one-shot prompt refers to a prompt that includes one example, and a few-shot prompt refers to a prompt that includes multiple examples. A prompt that includes no examples may be referred to as a zero-shot prompt.

FIG. 1 illustrates an example computing system 500, which may be used to implement examples of the present disclosure, such as a prompt generation engine to generate prompts to be provided as input to a language model such as an LLM. Additionally, or alternatively, one or more instances of the example computing system 500 may be employed to execute the LLM. For example, a plurality of instances of the example computing system 500 may cooperate to provide output using an LLM in manners as discussed above.

The example computing system 500 includes at least one processing unit, such as a processor 502, and at least one physical memory 504. The processor 502 may be, for example, a central processing unit, a microprocessor, a digital signal processor, an application-specific integrated circuit (ASIC), a field-programmable gate array (FPGA), a dedicated logic circuitry, a dedicated artificial intelligence processor unit, a graphics processing unit (GPU), a tensor processing unit (TPU), a neural processing unit (NPU), a hardware accelerator, or combinations thereof. The memory 504 may include a volatile or non-volatile memory (e.g., a flash memory, a random-access memory (RAM), and/or a read-only memory (ROM)). The memory 504 may store instructions for execution by the processor 502, to the computing system 500 to carry out examples of the methods, functionalities, systems and modules disclosed herein.

The computing system 500 may also include at least one network interface 506 for wired and/or wireless communications with an external system and/or network (e.g., an intranet, the Internet, a P2P network, a WAN and/or a LAN). A network interface may enable the computing system 500 to carry out communications (e.g., wireless communications) with systems external to the computing system 500, such as a language model residing on a remote system.

The computing system 500 may optionally include at least one input/output (I/O) interface 508, which may interface with optional input device(s) 510 and/or optional output device(s) 512. Input device(s) 510 may include, for example, buttons, a microphone, a touchscreen, a keyboard, etc. Output device(s) 512 may include, for example, a display, a speaker, etc. In this example, optional input device(s) 510 and optional output device(s) 512 are shown external to the computing system 500. In other examples, one or more of the input device(s) 510 and/or output device(s) 512 may be an internal component of the computing system 500.

A computing system, such as the computing system 500 of FIG. 1, may access a remote system (e.g., a cloud-based system) to communicate with a remote language model or LLM hosted on the remote system such as, for example, using an application programming interface (API) call. The API call may include an API key to enable the computing system to be identified by the remote system. The API call may also include an identification of the language model or LLM to be accessed and/or parameters for adjusting outputs generated by the language model or LLM, such as, for example, one or more of a temperature parameter (which may control the amount of randomness or "creativity" of the generated output) (and/or, more generally some form of random seed as serves to introduce variability or variety into the output of the LLM), a minimum length of the output (e.g., a minimum of 10 tokens) and/or a maximum length of the output (e.g., a maximum of 1000 tokens), a frequency penalty parameter (e.g., a parameter which may lower the likelihood of subsequently outputting a word based on the number of times that word has already been output), a "best of" parameter (e.g., a parameter to control the number of times the model will use to generate output after being instructed to, e.g., produce several outputs based on slightly varied inputs). The prompt generated by the computing system is provided to the language model or LLM and the output (e.g., token sequence) generated by the language model or LLM is communicated back to the computing system. In other examples, the prompt may be provided directly to the language model or LLM without requiring an API call. For example, the prompt could be sent to a remote LLM via a network such as, for example, as or in message (e.g., in a payload of a message).

Figure 4:
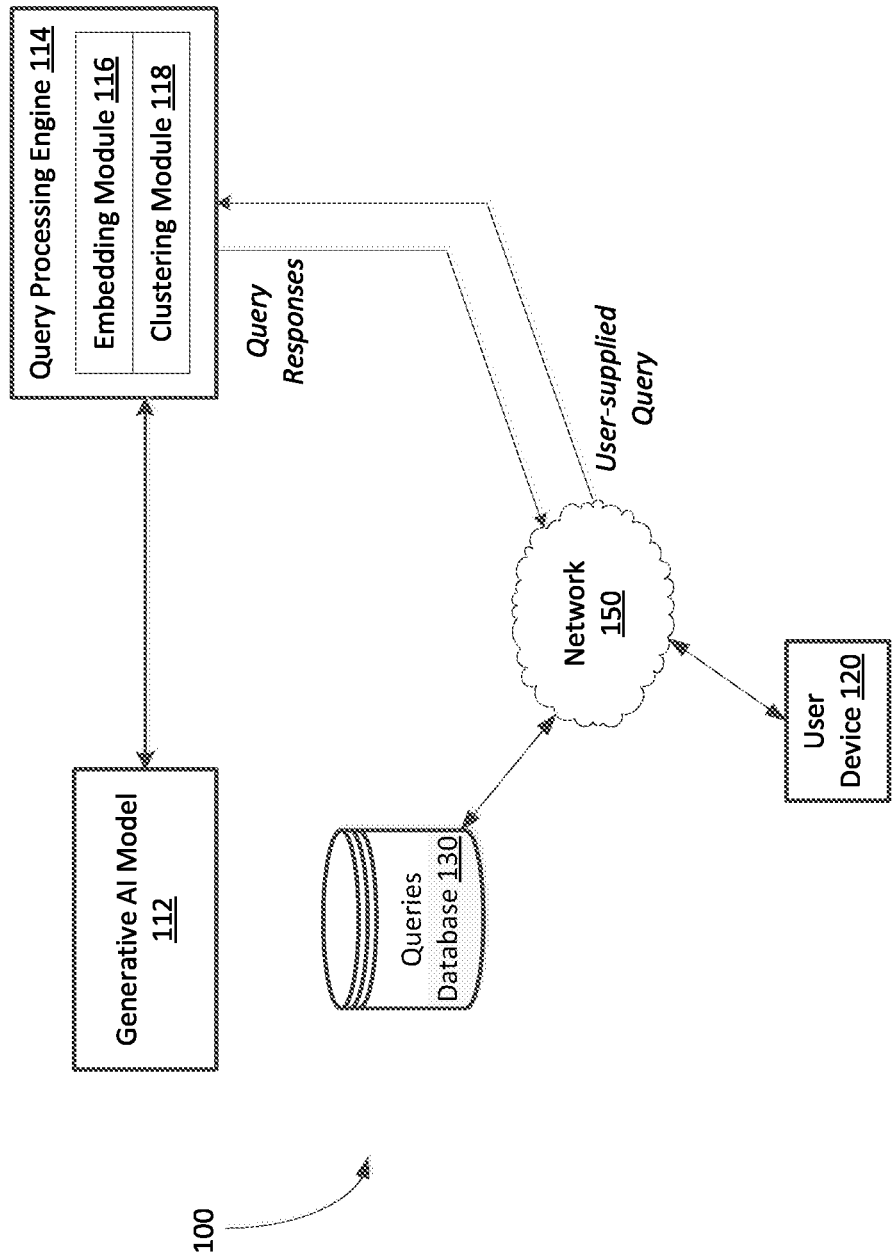
FIG. 4 illustrates, in block diagram form, an example system for implementing a query processing engine that integrates use of a generative AI model.

Reference is now made to FIG. 4, which illustrates, in block diagram form, an example system 100 for implementing a query management system. The system 100 may be implemented using one or more computing devices.

The system 100 includes a generative AI model 112, a query processing engine 114, an embedding module 116, a clustering module 118, and a queries database 130. The generative AI model 112 is an unsupervised or semi-supervised machine learning algorithm that has been trained using a set of training data content. The generative AI model 112 may be a transformer 50 (FIG. 3), as described above. Input prompts may be provided to the generative AI model 112, and the model may produce outputs related to the input prompts. The generative AI model 112 may be a generative adversarial network, and/or a transformer-based model.

The query processing engine 114 is configured to receive user-supplied queries from user devices 120 via a network 150. In the context of a service platform, the user-supplied queries may be customer queries. A customer query may comprise an email message, a portal message, a chat input, etc. submitted by a customer that contains at least one question or issue. All or a subset of queries from customers of the platform may be channeled to the query processing engine 114. Upon processing a query from a customer, the query processing engine 114 may generate a suitable response. A response to a customer query may, for example, include at least one solution to an identified question/issue within the query. The responses generated by the query processing engine 114 may be communicated to the user devices 120 via the network 150. For example, a query response may be provided to a user device 120 for displaying on a graphical user interface associated with the service platform.

In at least some implementations, a user-supplied query may be modified by the query processing engine to generate a suitable prompt for inputting to the generative AI model 112. For example, an input prompt may be generated by adjusting a user-supplied query in accordance with one or more defined constraints associated with the generative AI model 112. The constraints may, for example, relate to restrictions (e.g., character limits, content filters, etc.) on acceptable prompts for the generative AI model 112.

The query processing engine 114 may be configured to perform searches of a relevant search space. The search may, for example, be a keyword search, a vector similarity search, or a hybrid search. The search space may comprise data sources, such as private or public repositories of data, document libraries, etc., or an embedding space corresponding to one or more such data sources. The query processing engine 114 may implement a suitable search algorithm which may depend, at least in part, on the type of requested search, the relevant search space, and/or the query data.

In some implementations, the query processing engine 114 may be configured to perform vector searches. A vector search uses vector embeddings for representing and searching content. The query processing engine 114 may index various data objects using vector embeddings. As a specific example, data queries, such as customer queries for a service platform, may be represented using embeddings. For each customer query, the text of the query may be wholly or partially represented by a suitable feature vector. In this way, a plurality of different customer queries may be embedded in a single embedding space.

An embedding module 116 creates vector representations of data. Embeddings are computed using machine learning models. The embedding module 116 is configured to implement one or more embedding models for processing different types of data. Examples of pre-trained embedding models which may be implemented include: Word2Vec, Doc2Vec, Universal Sentence Encoder, Global Vectors (GloVe), Embeddings from Language Models (ELMo), FastText, MobileNet v2. SentenceBERT, InferSent, etc.

The query processing engine 114 is configured to compute similarity between the vectors in an embedding space. In particular, the query processing engine 114 may use one or more metrics for calculating vector similarity such as, but not limited to, L2 (Euclidean) distance, cosine similarity, and inner product (dot product). Various algorithms for vector similarity search may be implemented by the search engine. Examples include k-nearest neighbor (kNN), approximate nearest neighbors (ANN) search, space partition tree and graph (SPTAG), Faiss, and hierarchical navigable small world (HNSW).

The clustering module 118 may perform clustering using the vector embeddings that are generated by the embedding module 116. In particular, the clustering module 118 may identify clusters in the embedding space. Clustering operations may be performed by implementing a suitable cluster model (e.g., connectivity model, centroid model, etc.) and clustering algorithm (e.g., DBSCAN, agglomerative clustering, spectral clustering, etc.). The clustering module 118 is configured to output information regarding clustering operations such as, for example, cluster labels, clustering algorithms, distance metric(s), linkage criterion, and cluster membership.

In at least some implementations, the generative AI model 112 and the query processing engine 114 may be included in, or be accessed by, a query management system. That is, a query management system may implement various functions of the generative AI model 112 and the query processing engine 114. While FIG. 4 shows the generative AI model 112 and the query processing engine 114 as separate components of system 100, it will be understood that the query processing engine 114 may be configured to implement various features of the generative AI model 112.

The network 150 is a computer network. In some implementations, the network 150 may be an internetwork such as may be formed of one or more interconnected computer networks. For example, the network 150 may be or may include an Ethernet network, an asynchronous transfer mode (ATM) network, a wireless network, or the like.

In some example implementations, the query processing engine 114 may be integrated as a component of an e-commerce platform. That is, an e-commerce platform may be configured to implement example embodiments of the query processing engine 114. In particular, the subject matter of the present application, including example methods for generating query responses, may be employed in the specific context of e-commerce. For example, the query processing engine 114 may be adapted to facilitate automatically handling queries from customers of an e-commerce platform.

Figure 5:
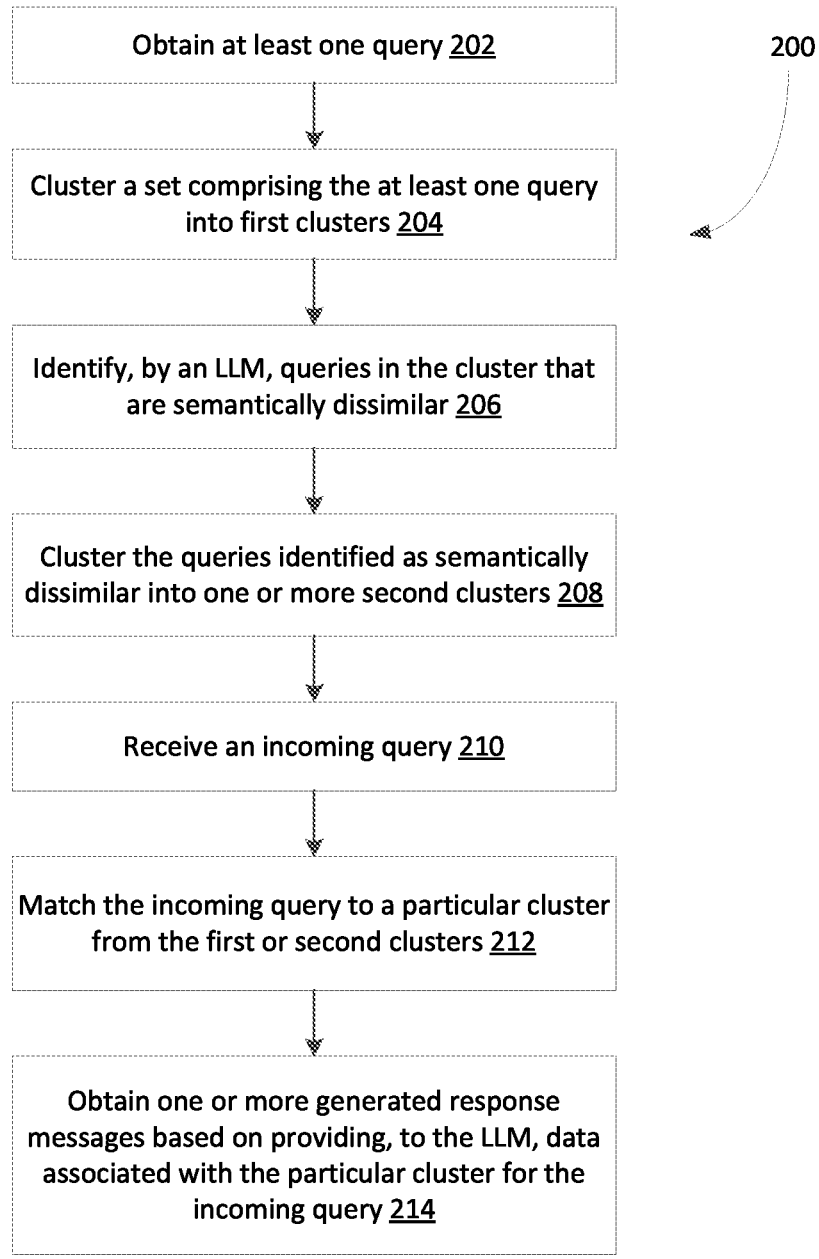
FIG. 5 shows, in flowchart form, an example method for generating responses to an incoming query.

Reference is now made to FIG. 5, which shows, in flowchart form, an example method 200 for generating responses to an incoming query. The method 200 may be implemented, at least in part, on a computing system for query management, such as the system 100 of FIG. 4.

A query management system may build and maintain a database of queries and corresponding responses. More particularly, as will be described in greater detail below, the database may include sets of questions/issues that are identified from query messages received by the system and one or more solutions corresponding to each question/issue. The query database may be built, for example, by processing large datasets of previously received queries. The system may use the query database in generating responses to incoming (and future) queries. Additionally, the system may dynamically update the database based on new query data.

The query database may be generated on an initial set of previous queries. In operation 202, the computing system obtains at least one previous query. A query may comprise an identifiable question or issue within a query message. Query messages may include, for example, inbound emails, portal messages, chat inputs, etc. that are received by the computing system via user devices. Various criteria may be used to determine which of the previous queries may be used to build the database. For example, the computing system may retrieve a defined number of the most recent queries. As another example, the computing system may retrieve all or a subset of queries that were received within a specific date range.

The computing system performs clustering on the set of previous queries, including the at least one query, to identify one or more first clusters, in operation 204. In particular, the previous queries obtained by the computing system are grouped into a set of first clusters. The computing system may first analyze the previous query messages and determine, for each message, at least one query. In some implementations, an LLM may be employed to facilitate identification of a query within a query message. The LLM may, for example, be instructed, by the computing system, to identify and summarize a primary query within each of the previous query messages. The previous queries may then be clustered based on semantic similarity. In order to perform clustering, the computing system may define a semantic similarity threshold for cluster creation. Similarity of queries may be represented, in some implementations, using a similarity score. The similarity threshold may, for example, be a numerical value representing a desired lower limit for indications of similarity (e.g., similarity scores) of queries belonging to the same cluster.

In at least some embodiments, a hierarchical clustering of the previous queries may be performed. For example, an agglomerative approach of merging pairs of clusters may be implemented by the computing system in order to obtain the first clusters. A suitable distance metric, such as the Euclidean distance, and linkage criterion (e.g., complete-linkage clustering, single-linkage clustering, etc.) may be selected by the computing system in performing the clustering.

For each of the first clusters, the computing system identifies queries in the cluster that are semantically dissimilar (operation 206). The computing system analyzes all of the queries within a cluster and determines if there are any queries having a meaning that is different from at least one other query of the cluster. In at least some implementations, an LLM may be instructed, by the computing system, to verify whether the queries of a same cluster indeed represent the same query. The LLM may, for example, compare the queries of the same cluster to determine semantic similarity. In particular, the LLM may process queries of the same cluster to determine refined semantic similarity between the queries. That is, even if the set of previous queries is initially clustered into first clusters (operation 204) based on semantic similarity, the LLM may effectively perform an additional level of filtering to identify, for a same cluster, queries of the cluster that are semantically dissimilar to one or more other queries of the cluster.

In some implementations, the computing system may provide the LLM with domain-specific information relating to the queries for performing the comparisons. The previous queries received by the computing system may relate to one or more domains (e.g., technical fields, disciplines, etc.). Domain-specific information, such as concepts, features, state information, etc., for a domain may provide additional context that enables an LLM to identify granular distinctions between queries of a same cluster. For example, the presence of domain-specific keywords in a certain query may allow for distinguishing the query from similar queries that do not contain such keywords, in a way that is relevant and meaningful for the particular domain of the queries.

In some implementations, the computing system may identify queries that are or represent the "same" query and create a new cluster level label for said queries. Queries that semantically map to a single query may be considered to be the same query. For example, questions in a cluster that are the same question may be labelled with one new question that best describes all of the "same" questions.

In operation 208, the computing system clusters the queries identified as semantically dissimilar into one or more second clusters. That is, the queries of a particular first cluster that are determined to be semantically dissimilar to others of said first cluster are grouped into new clusters. The dissimilar queries may be assigned to a new cluster (i.e., a second cluster) having a cluster level label that is different from the label for the cluster containing the similar queries. In this way, the set of all previous queries received by the computing system can be divided into a plurality of first and second clusters. This "filtering" of clusters of queries may proceed iteratively and facilitates creation of refined clusters that contain semantically equivalent queries.

When an incoming query message is received (operation 210), the computing system identifies a query within the incoming message and matches said query to a particular cluster from the first or second clusters, in operation 212. The matched cluster contains previous queries that are semantically similar to the incoming query. The computing system then obtains one or more response messages for the incoming query. More particularly, the computing system may obtain generated responses based on providing, to the LLM, data associated with the matched cluster (operation 214). The cluster data for the matched cluster may include, for example, one or more responses that were previously provided by the computing system in reply to a query associated with the matched cluster. A response may comprise at least one solution to a question/issue. The responses (e.g., solutions) to previous queries may be stored, for example, in the query database in association with the corresponding queries. Additionally, or alternatively, the computing system may provide, to the LLM, one or more solution steps associated with the matched cluster. The computing system may optionally provide, to the LLM, input of text associated with one or more resource documents that are to the query of the matched cluster.

In some implementations, the response messages may comprise at least one prompt for the LLM for generating additional responses. Additionally, or alternatively, the response messages may comprise representative examples of responses based on those associated with queries of a single cluster.

Figure 6:
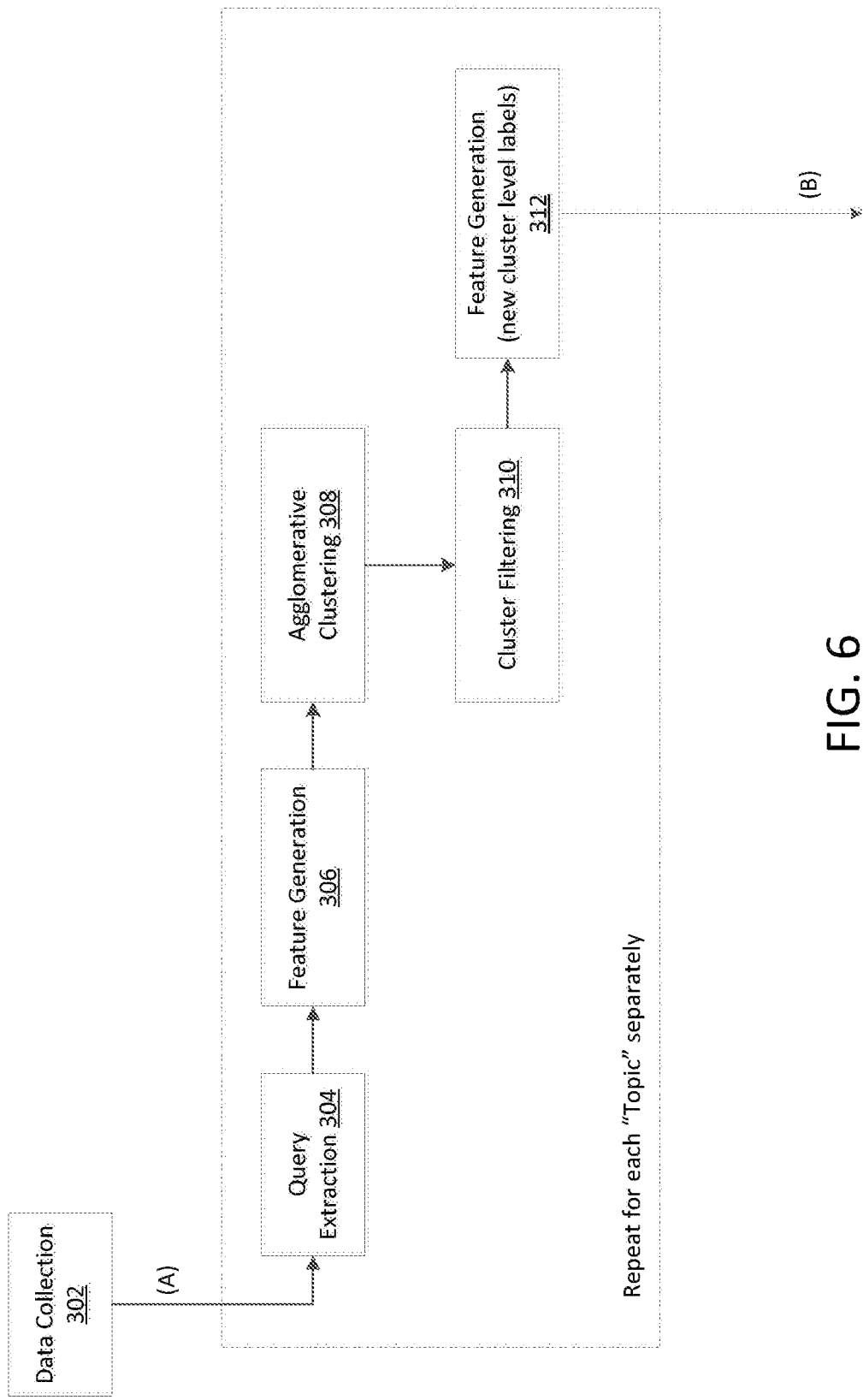
FIGS. 6 and 7 illustrate an example process flow for generating a database comprising queries and corresponding responses.
Figure 7:
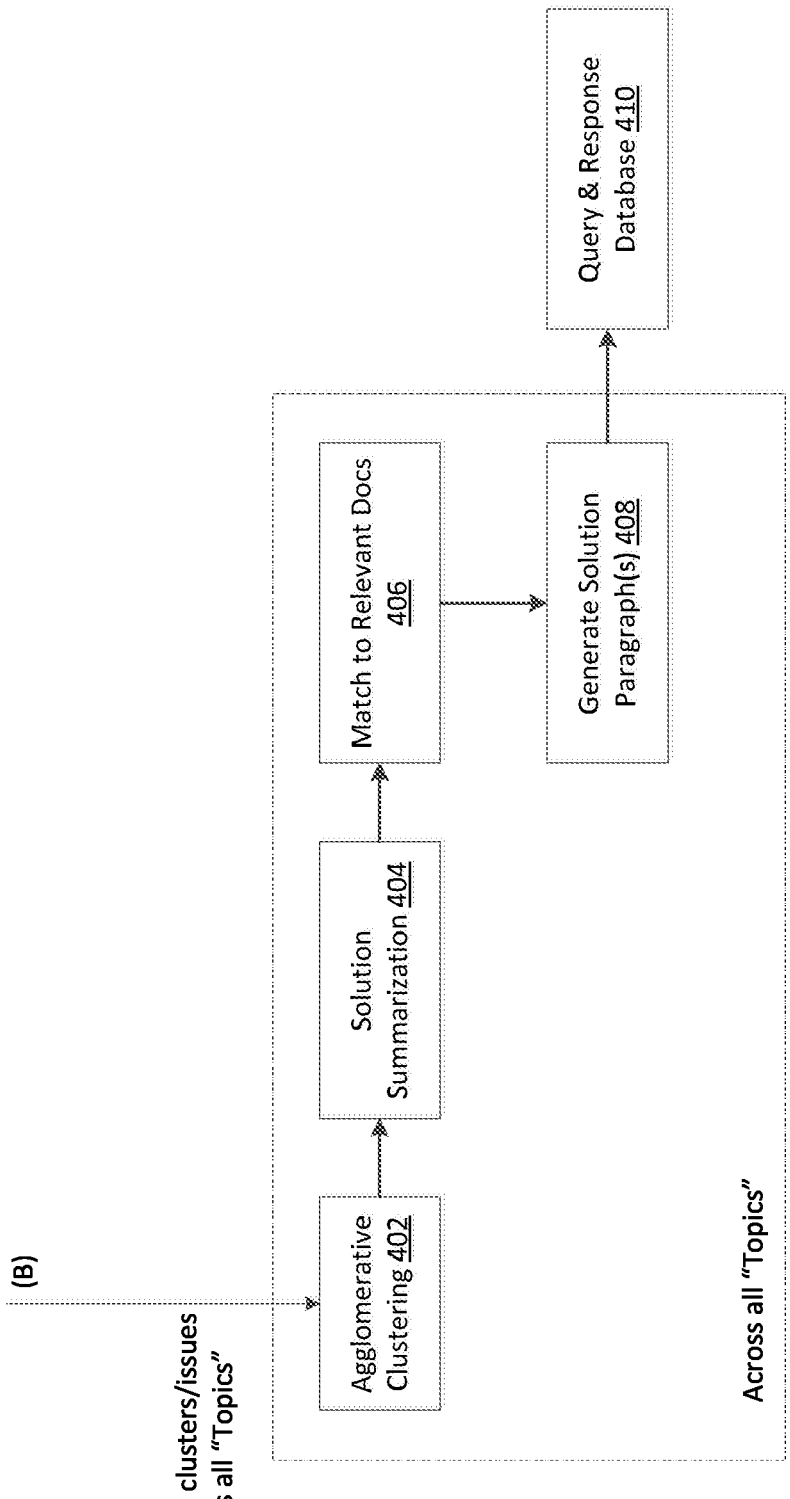

A process flow for generating responses to incoming queries in accordance with example embodiments of the present disclosure is illustrated in FIGS. 6 to 7. The illustrated operations may be implemented, at least in part, on a computing system for query management, such as the system 100 of FIG. 4. For example, a computing system that processes queries directed to a service platform (e.g., queries from customers of the platform) may perform the operations shown in FIGS. 6 to 7.

In operation 302, the computing system performs collection of relevant data for processing incoming queries. More particularly, the computing system collects historical query data that includes previously received query messages (e.g., emails, portal messages, inbox messages, etc.) for a platform or service provider and the first responses (e.g., from a Support Advisor) to the messages, for a plurality of categories or topics. The historical query data may be obtained, for example, from a queries database (such as database 130 of FIG. 4) or other data repository containing queries data.

In at least some implementations, the historical query data may be provided to an LLM with instructions to process the previous query messages. For each previous query message, the LLM may be instructed to identify a query (e.g., a primary question, issue, etc.) within or related to the message (operation 304). The query of the message may optionally be summarized to, for example, shorten to a defined similar word length across different queries. The LLM may also be instructed to obtain and summarize a solution to the identified query of the query message. For example, the first response to a previous query message may be formulated (e.g., by summarizing) into a short "solution" (e.g., via an OpenAI text generation call) corresponding to the previous query.

The computing system then generates feature vectors which facilitates clustering of similar queries, in operation 306. The historical query data, including all or a subset of previous queries, may be provided to an embedding engine to create the feature vectors. By way of example, a previous query message may be provided directly to an embedding engine which would generate an embedding for the query associated with the message in a relevant feature space. As another example, for each query extracted from a previous query message, the computing system may provide the query to the embedding engine for generating a suitable embedding.

The feature set corresponding to the feature vectors may include two parts. The first part of the feature set may relate to the text of the extracted query itself. That is, embeddings may be generated from the text of the extracted query. The text embeddings may be generated, for example, using an OpenAI™ embeddings call. As explained above, domain-specific information may provide additional context that enables an LLM to identify granular distinctions between queries of a same cluster. In order to embed the extracted query with domain-specific information, a further second part of the feature set may be included and relate to presence of domain specific keywords. In particular, the second part may relate to predefined domain-specific keywords in the extracted query. The keywords may, for example, be extracted and clustered from help documentation (or other knowledge base document) for the service platform.

The second part of the feature set may be generated as a series of numbers (e.g., a binary series) based on whether or not, in any given query, a word that represents a keyword cluster is present. For example, a set of related keywords (e.g., "Google", "Google Analytics", "SEO", "page rank") may together form a cluster. For a given query, if it contains at least one of the keywords of a cluster, the vector value for the cluster would be a "1". Each row in the second part of the feature vector may correspond to a cluster of keywords. The value in the particular row, e.g., 0 or 1, may indicate whether at least one keyword in the corresponding cluster is present.

In some implementations, a correct solution to an extracted query may be dependent on metadata associated with the querying user of the platform (e.g., a merchant) such as, for example, location of the merchant's store, apps installed on the merchant's store, subscription plan, history of the store or merchant, or other state information associated with the merchant. The feature set for the query embeddings may additionally include these parameters relating to the metadata (or other representations of contextual data).

Once the embeddings are created, the computing system creates clusters of the embeddings. In particular, the computing system may perform agglomerative clustering of the generated embeddings (operation 308). A clustering engine (such as the clustering module 118 of FIG. 4) may implement a suitable clustering algorithm by defining a distance metric and linkage criterion to create the clusters. A threshold for cluster creation may be manually set for each category/topic, and may represent which queries appear to be semantically the same (or nearly same).

The computing system may then instruct the LLM to verify whether the queries in a given cluster are indeed the same. More particularly, the LLM may be used to "refine" the clusters of the embeddings (operation 310). Queries in a cluster that are the same query may be labelled with a new query that best describes all the "same queries". In this way, new labels may effectively be generated at cluster level. The queries that are different may be separated out into their own clusters. That is, the LLM may be instructed to create a new label (or keep them unlabeled) for queries that are deemed to be dissimilar to other queries within the cluster. An advantage of using the LLM in this step is that it is able to distinguish between queries in the same cluster that may have met the defined threshold criteria (i.e., vectors that are within a threshold distance from each other) but that may be substantially different semantically.

The step of feature generation for clustering may be repeated, with the new cluster level labels, i.e., queries (operation 312). That is, new feature vectors may be generated that include two feature set parts—a first feature set part of embeddings for the new label and a second feature set part relating to presence of defined domain-specific keywords. The clusters of embeddings are then combined across multiple different categories/topics, and a higher threshold for cluster creation may be set. Agglomerative clustering may be performed again (operation 402), using the new threshold, and the result is the creation of new clusters, where only queries that are almost certainly the "same" query are clustered. The clustering and refining of clusters can proceed iteratively until the queries within each cluster cannot be distinguished from each other, i.e., increase the certainty that the clusters contain the same query.

For each query within a cluster, there may be one or more associated solutions. The LLM may be instructed to select and summarize (e.g., via an OpenAI text generation call) a defined number of the most common solutions into one or more "solution steps" that can later be used to generate a more detailed solution paragraph (operation 404).

In some implementations, the solutions may be embedded and matched to previously embedded sections of a knowledge base, such as help documentation (operation 406). The text associated with the closest matches of knowledge base resources may be extracted. There may be additional resources that the solution is mapped to, i.e., a reference for a previous support ticket.

For each query and solution combination, the computing system may supply the LLM with the query, the solution (and all associated "solution steps"), and any additional resources (e.g., text of help documentation), and instruct it to generate a solution paragraph (operation 408). The final output dataset produced by the LLM may contain a set of queries and a defined number of potential solution paragraphs per query. The output may be used to update a query and response database, in operation 410. In particular, the computing system may add the output dataset to a database storing queries and responses data.

Example Use Case

Upon receiving a new inbound message, the computing system may identify, summarize, and embed a query extracted from the inbound message using an LLM. The extracted query may then be matched to a most similar previous query using a similarity measure (e.g., cosine similarity). The computing system may determine whether the most similar query has at least a threshold number of solutions associated with it; if it doesn't, the next most similar query to have the threshold number of solutions is identified. In some implementations, the computing system may prompt the LLM to indicate whether the extracted query is the same query as the most similar previous query. For example, the computing system may provide an input prompt comprising a question of whether the extracted query is the same as the most similar previous query.

For the closest matching query, up to 3 pre-generated solution paragraphs are used by the LLM to generate 3 final response messages. The computing system then returns up to 3 potential messages, with "subject lines" also generated by the LLM text generation call describing each message and a description of the query that the inbound message matched to, to facilitate decision-making by support advisors. Additionally, or alternatively, the computing system may output a few-shot prompt (i.e., the prompt includes a number of examples of input and an associated desired output).

Implementations

The methods and systems described herein may be deployed in part or in whole through a machine that executes computer software, program codes, and/or instructions on a processor. The processor may be part of a server, cloud server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more threads. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In some implementations, the process may be a dual core processor, quad core processors, other chip-level multiprocessor and the like that combine two or more independent cores (called a die).

The methods and systems described herein may be deployed in part or in whole through a machine that executes computer software on a server, cloud server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM. ROM and the like. The processes, methods, program codes, instructions described herein and elsewhere may be executed by one or more of the network infrastructural elements.

The methods, program codes, and instructions described herein and elsewhere may be implemented in different devices which may operate in wired or wireless networks. Examples of wireless networks include 4th Generation (4G) networks (e.g., Long-Term Evolution (LTE)) or 5th Generation (5G) networks, as well as non-cellular networks such as Wireless Local Area Networks (WLANs). However, the principles described therein may equally apply to other types of networks.

The operations, methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another, such as from usage data to a normalized usage dataset.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable devices, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above, and combinations thereof may be embodied in computer executable code that, when executing on one or more computing devices, performs the steps thereof. In another aspect, the methods may be embodied in systems that perform the steps thereof and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

The invention claimed is:

1. A computer-implemented method, comprising:
   obtaining at least one query;
   clustering a set of queries including the at least one query into first clusters;
   for each first cluster, identifying, by a large language model (LLM), queries in that cluster that are semantically dissimilar;
   clustering the queries identified as semantically dissimilar into one or more second clusters;

receiving an incoming query;

matching the incoming query to a particular cluster from the first or second clusters;

obtaining one or more generated response messages based on providing, to the LLM, data associated with the particular cluster for the incoming query.

2. The method of claim 1, wherein the one or more generated response messages comprise at least one prompt for the LLM for generating additional responses.

3. The method of claim 1, wherein the one or more generated response messages comprise representative examples of responses based on those associated with queries of a single cluster.

4. The method of claim 1, further comprising generating, for each query of the at least one query, an embedding and wherein performing clustering comprises creating clusters based on the embeddings associated with the queries.

5. The method of claim 4, wherein the embedding comprises a feature vector containing a first vector representing an embedding of the query and a second vector associated with defined domain-specific keywords.

6. The method of claim 1, wherein obtaining the one or more generated response messages comprises providing, to the LLM, one or more solution steps associated with the particular cluster for the incoming query.

7. The method of claim 1, further comprising providing instructions for the LLM to identify and summarize the at least one query.

8. The method of claim 1, wherein clustering the set of queries including the at least one query into first clusters comprises defining at least one semantic similarity threshold for cluster creation.

9. The method of claim 1, wherein clustering the queries identified as semantically dissimilar into one or more second clusters comprises:

identifying queries that are a same query and creating a new cluster level label; and assigning the identified queries to a new cluster having the new cluster level label.

10. The method of claim 1, wherein obtaining the one or more generated response messages comprises further providing, to the LLM, input of text associated with a related resource document.

11. A computing system, comprising:

a processor;

a memory coupled to the processor, the memory storing computer-executable instructions that, when executed by the processor, are to cause the processor to:

obtain at least one query;

cluster a set of queries including the at least one query into first clusters;

for each first cluster, identify, by a large language model (LLM), queries in that cluster that are semantically dissimilar;

cluster the queries identified as semantically dissimilar into one or more second clusters;

receive an incoming query;

match the incoming query to a particular cluster from the first or second clusters; and obtain one or more generated response messages based on providing, to the LLM, data associated with the particular cluster for the incoming query.

12. The computing system of claim 11, wherein the one or more generated response messages comprise at least one prompt for the LLM for generating additional responses.

13. The computing system of claim 11, wherein the one or more generated response messages comprise representative examples of responses based on those associated with queries of a single cluster.

14. The computing system of claim 11, wherein the instructions, when executed, are to further cause the processor to generate, for each query of the at least one query, an embedding and wherein performing clustering comprises creating clusters based on the embeddings associated with the queries.

15. The computing system of claim 14, wherein the embedding comprises a feature vector containing a first vector representing an embedding of the query and a second vector associated with defined domain-specific keywords.

16. The computing system of claim 11, wherein obtaining the one or more generated response messages comprises providing, to the LLM, one or more solution steps associated with the particular cluster for the incoming query.

17. The computing system of claim 11, wherein the instructions, when executed, are to further cause the processor to provide instructions for the LLM to identify and summarize the at least one query.

18. The computing system of claim 11, wherein clustering the set of queries including comprising the at least one query into first clusters comprises defining at least one semantic similarity threshold for cluster creation.

19. The computing system of claim 11, wherein clustering the queries identified as semantically dissimilar into one or more second clusters comprises:

identifying queries that are a same query and creating a new cluster level label; and assigning the identified queries to a new cluster having the new cluster level label.

20. A non-transitory processor-readable medium storing processor-executable instructions that, when executed by a processor, are to cause the processor to:

obtain at least one query;

cluster a set of queries including the at least one query into first clusters;

for each first cluster, identify, by a large language model (LLM), queries in that cluster that are semantically dissimilar;

cluster the queries identified as semantically dissimilar into one or more second clusters;

receive an incoming query;

match the incoming query to a particular cluster from the first or second clusters; and obtain one or more generated response messages based on providing, to the LLM, data associated with the particular cluster for the incoming query.

* * * * *